United States Patent
Grella et al.

(10) Patent No.: US 8,089,051 B2
(45) Date of Patent: Jan. 3, 2012

(54) ELECTRON REFLECTOR WITH MULTIPLE REFLECTIVE MODES

(75) Inventors: Luca Grella, Gilroy, CA (US); Regina Freed, Mt. View, CA (US); Mark A. McCord, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 12/711,966

(22) Filed: Feb. 24, 2010

(65) Prior Publication Data

US 2011/0204251 A1    Aug. 25, 2011

(51) Int. Cl.
    *G21K 1/08*    (2006.01)
(52) U.S. Cl. .......... 250/396 R; 250/396 ML; 250/492.1; 250/492.2; 250/492.22; 250/492.3
(58) Field of Classification Search ............... 250/306, 250/307, 311, 492.11, 492.2, 492.22, 492.3, 250/396 R, 396 ML
    See application file for complete search history.

(56) References Cited

U.S. PATENT DOCUMENTS

| | | |
|---|---|---|
| 5,504,385 A | 4/1996 | Jin et al. |
| 5,588,894 A | 12/1996 | Jin et al. |
| 5,681,196 A | 10/1997 | Jin et al. |
| 5,698,934 A | 12/1997 | Jin et al. |
| 5,821,679 A | 10/1998 | Makishima |
| 6,177,218 B1 | 1/2001 | Felker et al. |
| 6,207,965 B1 | 3/2001 | Koike |
| 6,235,450 B1 | 5/2001 | Nakasuji |
| 6,291,119 B2 | 9/2001 | Choi et al. |
| 6,333,508 B1 | 12/2001 | Katsap et al. |
| 6,414,313 B1 | 7/2002 | Gordon et al. |
| 6,429,443 B1 | 8/2002 | Mankos et al. |
| 6,511,048 B1 | 1/2003 | Sohda et al. |
| 6,525,328 B1 | 2/2003 | Miyoshi et al. |
| 6,573,516 B2 | 6/2003 | Kawakami |
| 6,586,733 B1 | 7/2003 | Veneklasen et al. |
| 6,605,811 B2 | 8/2003 | Holta et al. |
| 6,610,890 B1 | 8/2003 | Garcia de Quesada Fort et al. |
| 6,657,211 B2 | 12/2003 | Benner |
| 6,674,086 B2 | 1/2004 | Kamada |
| 7,061,591 B2 | 6/2006 | Bleeker et al. |
| 2003/0210383 A1 | 11/2003 | Bjorklund et al. |

FOREIGN PATENT DOCUMENTS

| | | |
|---|---|---|
| EP | 1510848 | 2/2005 |
| JP | 4294319 | 10/1992 |

*Primary Examiner* — Robert Kim
*Assistant Examiner* — Hanway Chang
(74) *Attorney, Agent, or Firm* — Okamoto & Benedicto LLP

(57) ABSTRACT

One embodiment relates to a method of controllably reflecting electrons from an array of electron reflectors. An incident electron beam is formed from an electron source, and the incident beam is directed to the array of electron reflectors. A first plurality of the reflectors is configured to reflect electrons in a first reflective mode such that the reflected electrons exiting the reflector form a focused beam. A second plurality of the reflectors is configured to reflect electrons in a second reflective mode such that the reflected electrons exiting the reflector are defocused. Another embodiment relates to an apparatus of a dynamic pattern generator for reflection electron beam lithography. Other embodiments, aspects and features are also disclosed.

14 Claims, 16 Drawing Sheets

|  | ON | OFF |
|---|---|---|
| Conventional | Reflected | Absorbed |
| Innovation | Reflected (Mode A) | Reflected (Mode B) |

FIG. 2

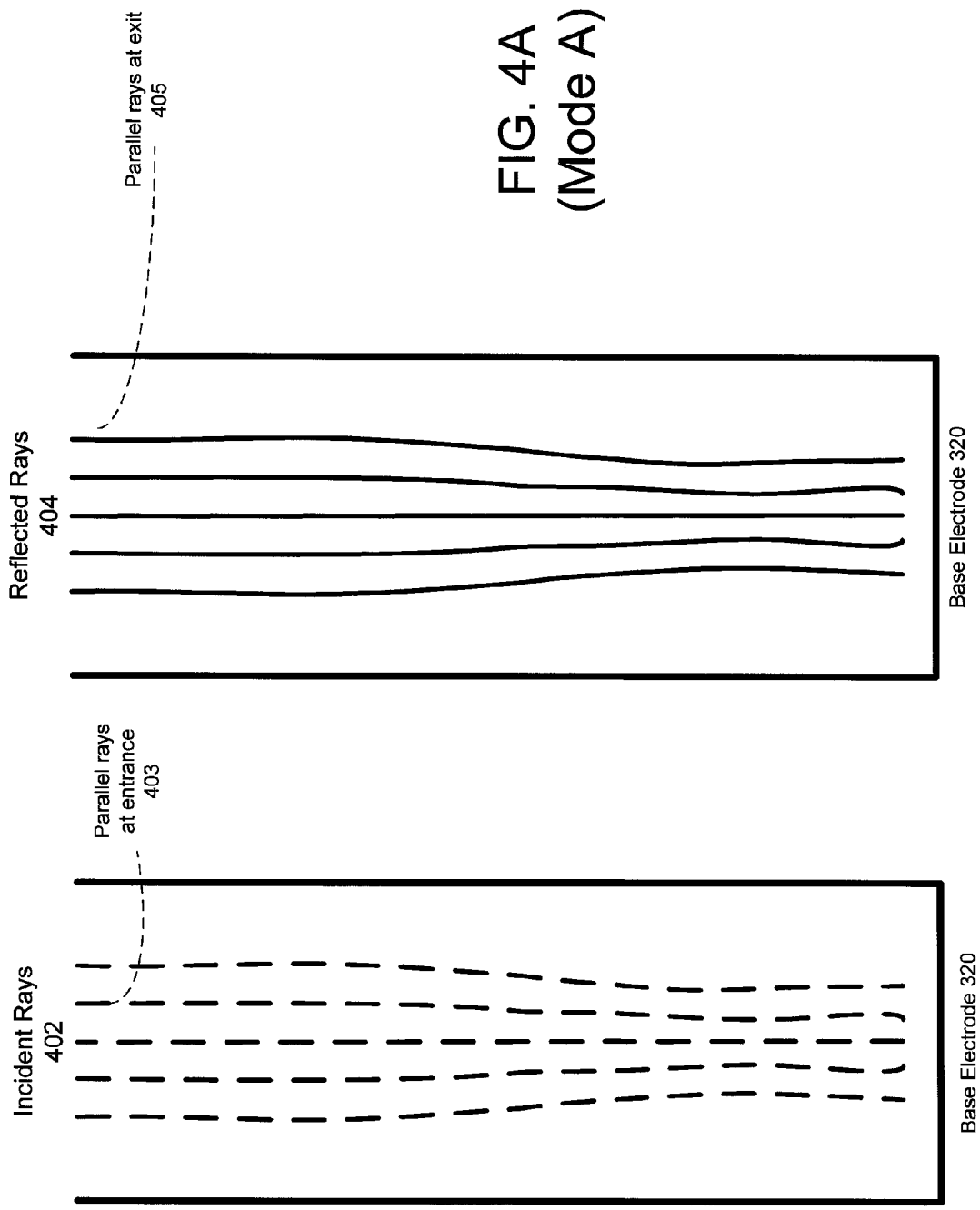

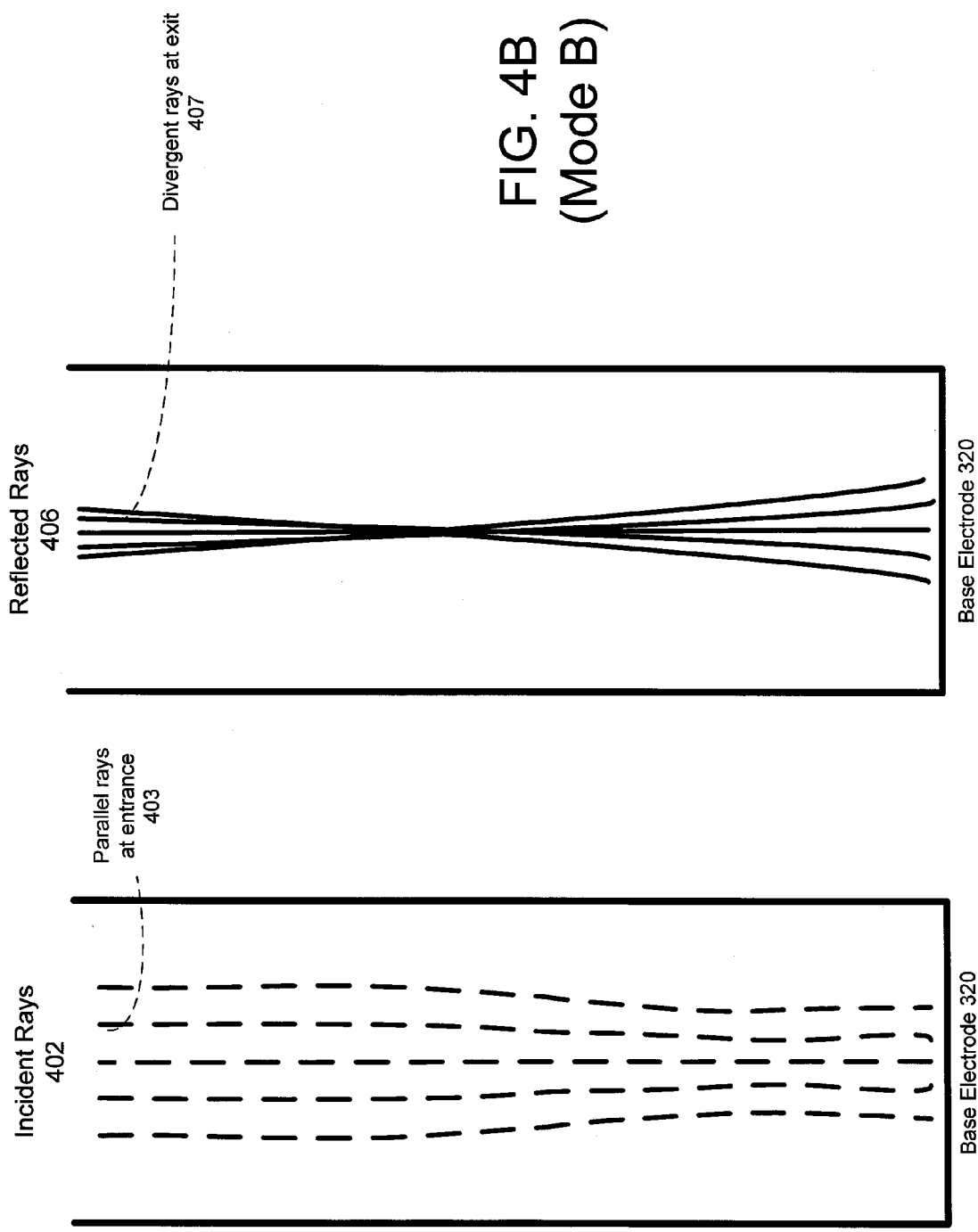

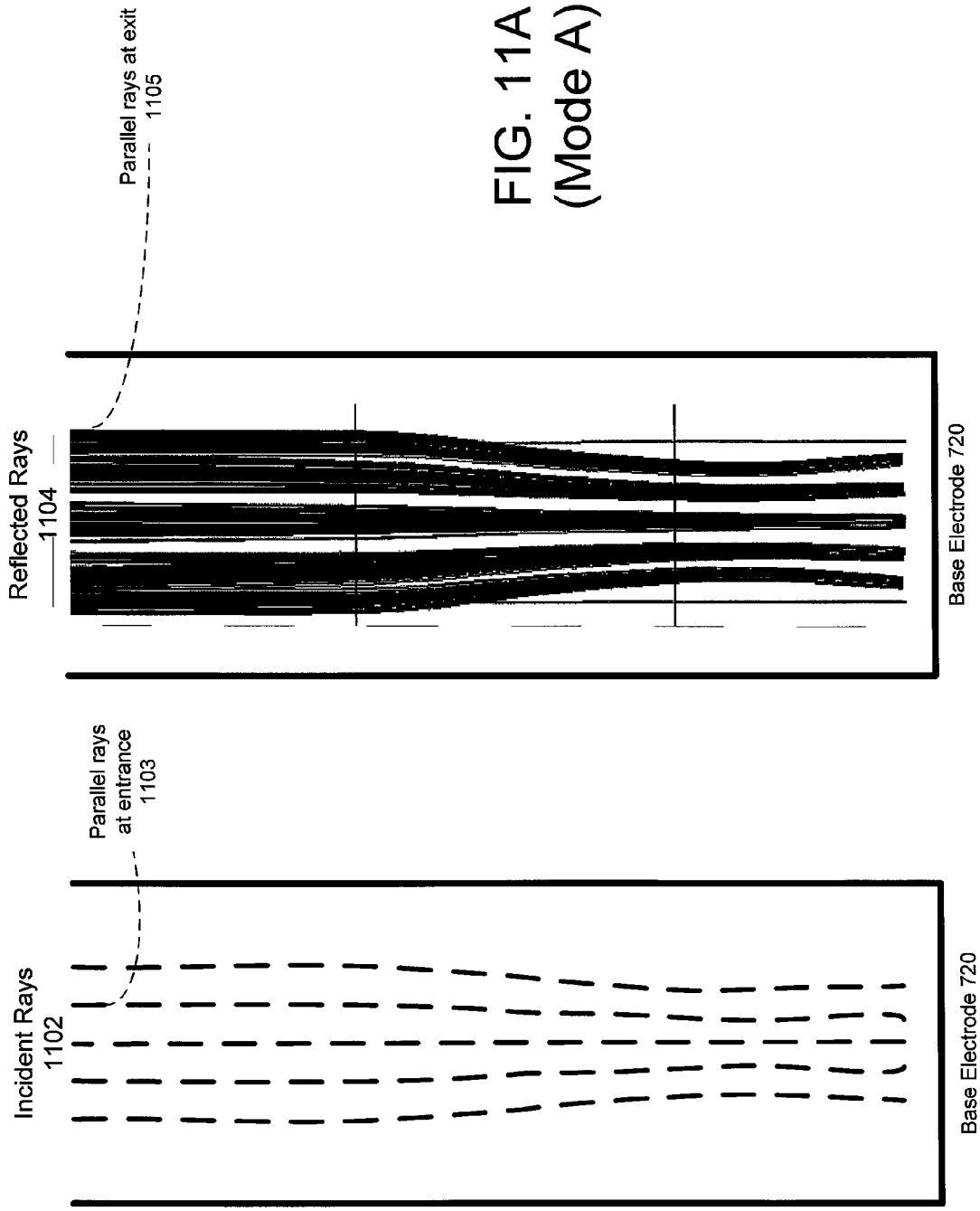

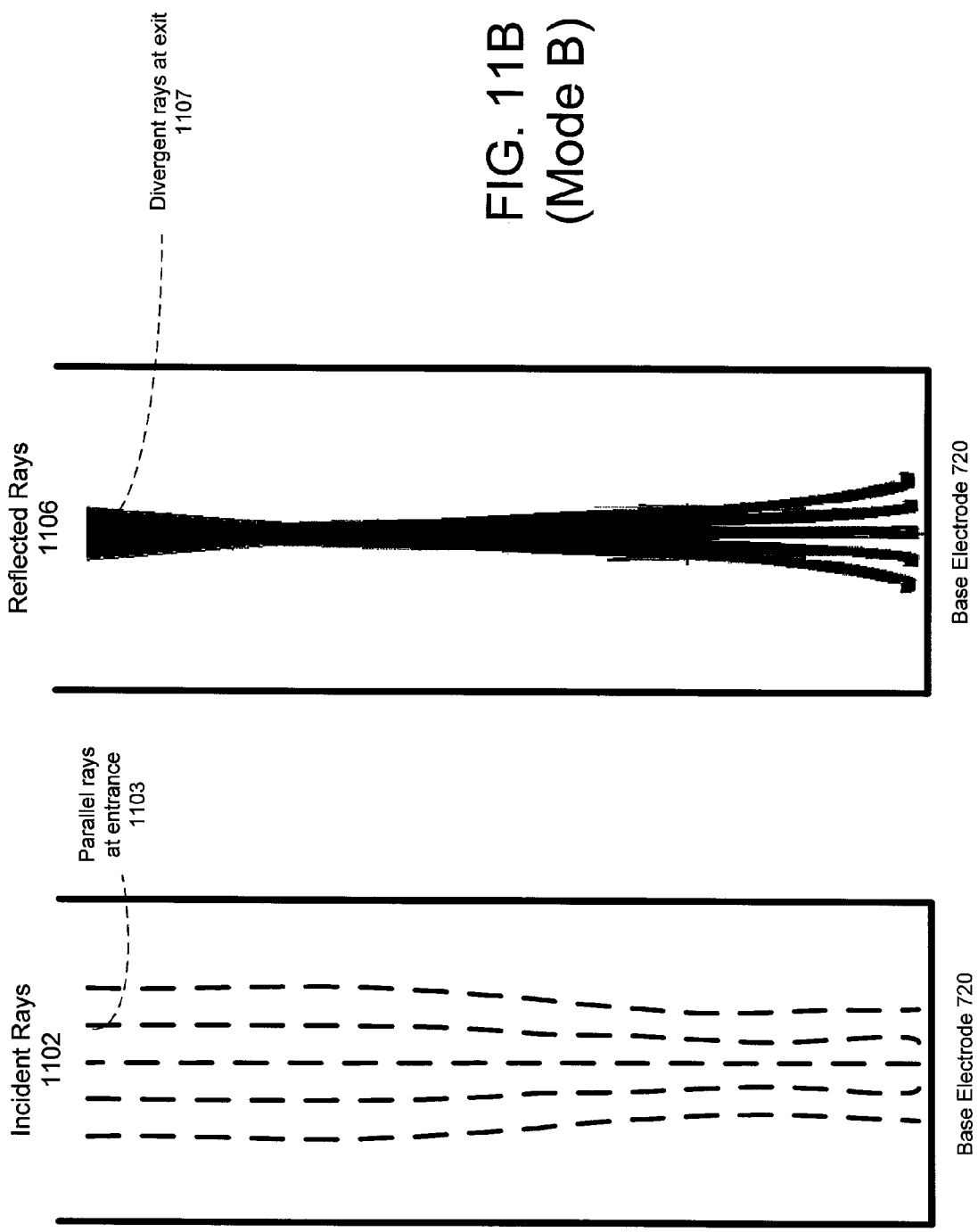

US 8,089,051 B2

ELECTRON REFLECTOR WITH MULTIPLE REFLECTIVE MODES

STATEMENT REGARDING FEDERALLY SPONSORED RESEARCH OR DEVELOPMENT

This invention was made with Government support under Agreement No. HR0011-07-9-0007 awarded by DARPA. The Government has certain rights in the invention.

BACKGROUND

1. Technical Field

The present invention relates generally to semiconductor manufacturing and related technologies. More particularly, the present invention relates to electron beam lithography.

2. Description of the Background Art

As is well-understood in the art, a lithographic process includes the patterned exposure of a resist so that portions of the resist can be selectively removed to expose underlying areas for selective processing such as by etching, material deposition, implantation and the like. Traditional lithographic processes utilize electromagnetic energy in the form of ultraviolet light for selective exposure of the resist. As an alternative to electromagnetic energy (including x-rays), charged particle beams have been used for high resolution lithographic resist exposure. In particular, electron beams have been used since the low mass of electrons allows relatively accurate control of an electron beam at relatively low power and relatively high speed. Electron beam lithographic systems may be categorized as electron-beam direct write (EBDW) lithography systems and electron beam projection lithography systems.

In EBDW lithography, the substrate is sequentially exposed by means of a focused electron beam, wherein the beam either scans in the form of lines over the whole specimen and the desired structure is written on the object by corresponding blanking of the beam, or, as in a vector scan method, the focused electron beam is guided over the regions to be exposed. The beam spot may be shaped by a diaphragm. EBDW is distinguished by high flexibility, since the circuit geometries are stored in the computer and can be optionally varied. Furthermore, very high resolutions can be attained by electron beam writing, since electron foci with small diameters may be attained with electron-optical imaging systems. However, it is disadvantageous that the process is very time-consuming, due to the sequential, point-wise writing. EBDW is therefore at present mainly used for the production of the masks required in projection lithography.

In electron beam projection lithography, analogously to optical lithography, a larger portion of a mask is illuminated simultaneously and is imaged on a reduced scale on a wafer by means of projection optics. Since a whole field is imaged simultaneously in electron beam projection lithography, the attainable throughputs can be markedly higher in comparison with electron beam writers. Disadvantages of conventional electron beam projection lithography systems includes that a corresponding mask is necessary for each structure to be exposed. The preparation of customer-specific circuits in small numbers is not economic, because of the high costs associated with mask production.

BRIEF DESCRIPTION OF THE DRAWINGS

FIG. 2 is diagram illustrating a substantial operational distinction between a pixel of a conventional dynamic pattern generator and a pixel of an innovative dynamic pattern generator in accordance with an embodiment of the invention.

FIG. 4A is a schematic diagram showing incident and reflected electron rays in a first mode of operation of a switchable multiple-electrode electron reflector with a flat base electrode in accordance with an embodiment of the invention.

FIG. 4B is a schematic diagram showing incident and reflected electron rays in a second mode of operation of a switchable multiple-electrode electron reflector with a flat base electrode in accordance with an embodiment of the invention.

FIG. 11A is a schematic diagram showing incident and reflected electron rays in a first mode of operation of a switchable multiple-electrode electron reflector with a concave base electrode in accordance with an embodiment of the invention.

FIG. 11B is a schematic diagram showing incident and reflected electron rays in a second mode of operation of a switchable multiple-electrode electron reflector with a concave base electrode in accordance with an embodiment of the invention.

SUMMARY

Figure 1:
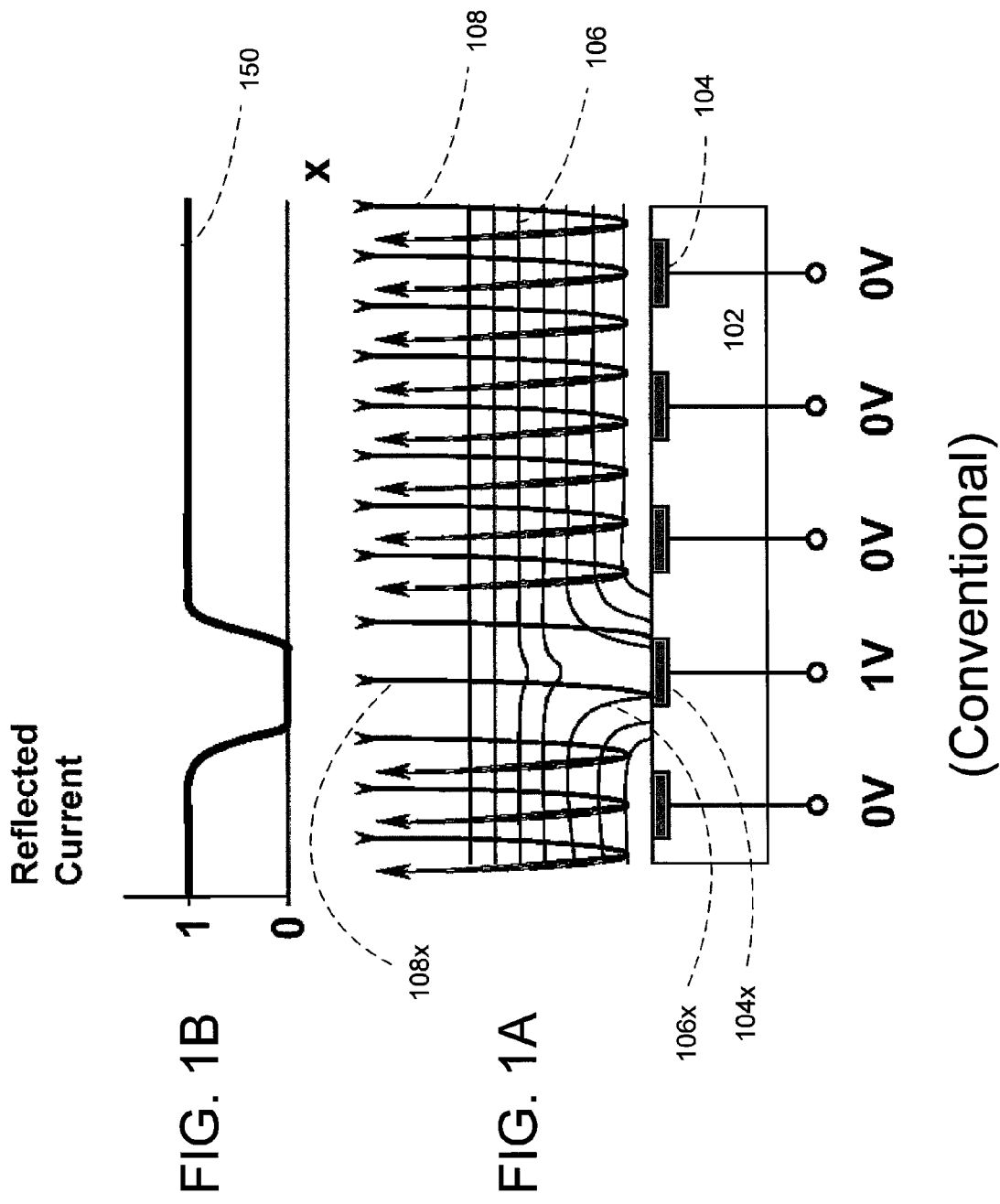
FIGS. 1A and 1B are diagrams illustrating the basic operation of a conventional dynamic pattern generator.

One embodiment relates to a method of controllably reflecting electrons from an array of electron reflectors. An incident electron beam is formed from an electron source, and the incident beam is directed to the array of electron reflectors. A first plurality of the reflectors is configured to reflect electrons in a first reflective mode such that the reflected electrons exiting the reflector form a focused beam. A second plurality of the reflectors is configured to reflect electrons in a second reflective mode such that the reflected electrons exiting the reflector are defocused.

Another embodiment relates to an apparatus of a dynamic pattern generator for reflection electron beam lithography. The apparatus includes a plurality of electron reflectors in an array. Control circuitry is provided for configuring a first plurality of the reflectors to reflect electrons in a first reflective mode such that the reflected electrons exiting the reflector form a focused beam and for configuring a second plurality of the reflectors to reflect electrons in a second reflective mode such that the reflected electrons exiting the reflector are defocused.

Other embodiments, aspects and features are also disclosed.

DETAILED DESCRIPTION

FIGS. 1A and 1B are diagrams illustrating the basic operation of a conventional dynamic pattern generator. FIG. 1A shows a cross-section of a DPG substrate 102 showing a column (or row) of pixels. Each pixel includes a conductive area 104. A controlled voltage level is applied to each pixel. In the example illustrated in FIG. 1A, four of the pixels 104 are "on" (reflective mode) and are grounded (have 0 volts applied thereto), while one pixel (with conductive area labeled 104x) is "off" (absorptive mode) and has a positive voltage (1 volt) applied thereto. The specific voltages will vary depending on the parameters of the system. The resultant local electrostatic equipotential lines 106 are shown, with distortions 106x relating to "off" pixel shown. In this example, the incident electrons 108 approaching the DPG 112 come to a halt in front of and are reflected by each of the "on" pixels, but the incident electrons 108x are drawn into and absorbed by the "off" pixel. The resultant reflected current (in arbitrary units) is shown in FIG. 1B. As seen from FIG. 1B, the reflected current is "0" for the "off" pixel and "1" for the "on" pixels.

FIG. 2 is diagram illustrating a substantial operational distinction between a pixel of a conventional dynamic pattern generator and a pixel of an innovative dynamic pattern generator in accordance with an embodiment of the invention. As seen, there are two states, an ON state and an OFF state, for each pixel. As shown in FIG. 1, for a conventional DPG, the pixel reflects electrons in the ON state and absorbs electrons in the OFF state (or vice versa).

In contrast, for an innovative DPG in accordance with an embodiment of the present invention, the pixel reflects electrons in both the ON and OFF states. While the incident electrons are reflected in both ON and OFF states, the mode of reflection differs between the ON and OFF states. As shown, the pixel may reflect electrons in "Mode A" in an ON state and in "Mode B" in an OFF state (or vice versa). As described further below, for example, the electrons may be reflected in a focused or parallel manner in Mode A and may be reflected in a de-focused or divergent manner in Mode B.

Figure 3A:
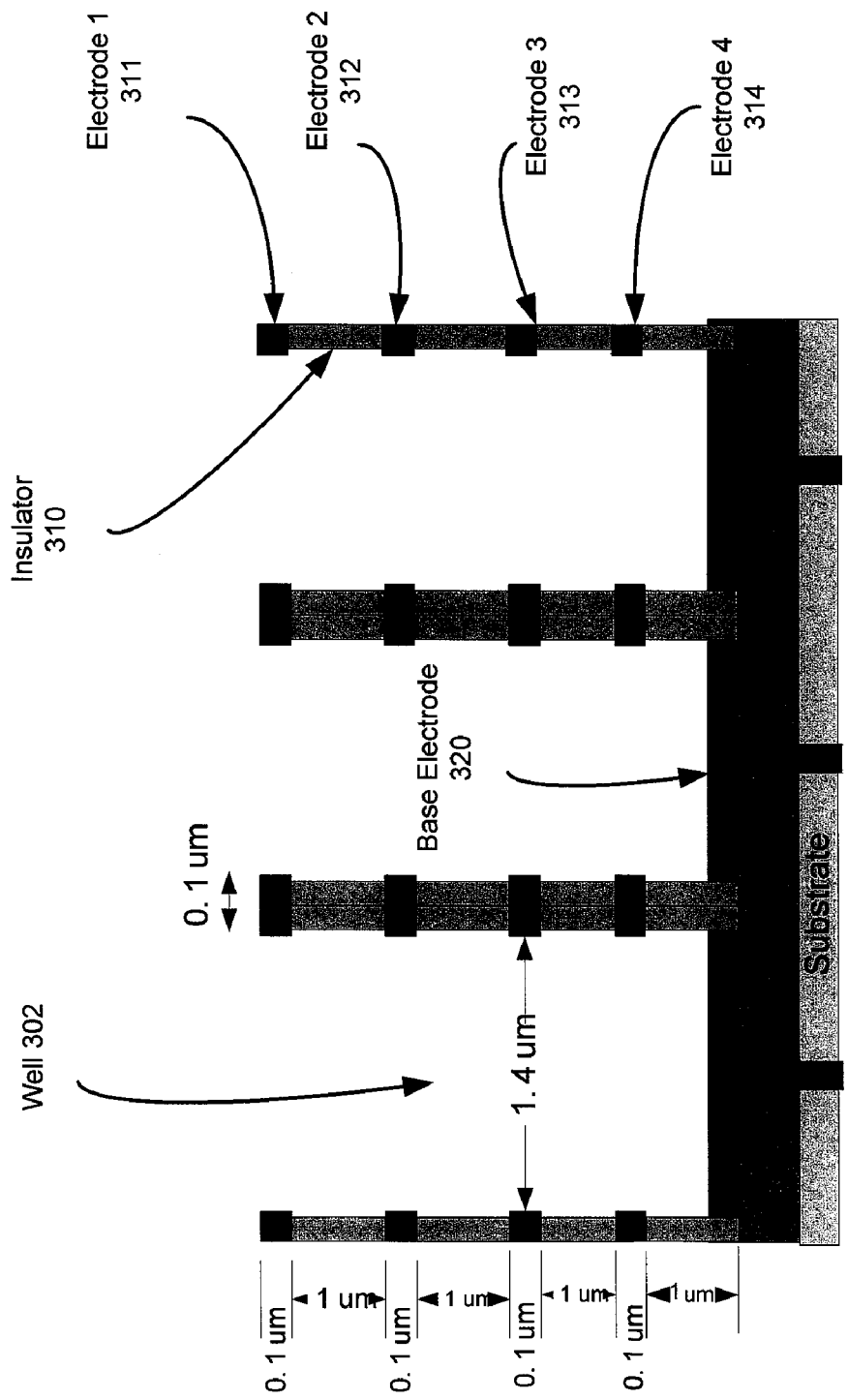
FIG. 3A is a cross-sectional diagram of a switchable multiple-electrode electron reflector for a pixel of a dynamic pattern generator in accordance with an embodiment of the invention.

FIG. 3A is a cross-sectional diagram of a switchable multiple-electrode electron reflector for a pixel of a dynamic pattern generator in accordance with an embodiment of the invention. The electron reflector structure shown in FIG. 3A includes multiple stacked electrodes configured to collect, focus (or de-focus), and extract electrons in accordance with an embodiment of the invention.

As shown, the sidewalls surrounding each well (cup) opening 302 comprises a stack with multiple conductive layers or electrodes (for example, 311, 312, 313, and 314) separated by insulating layers 310. In addition, each well includes a base electrode 320 at the bottom of each well. The stacked electrode well structure may be fabricated on a silicon substrate (with an oxide layer on the substrate).

As shown in FIG. 3A, a preferred embodiment may include the base electrode and four stacked electrodes (five electrodes total) in the well structure. Other embodiments may include a total number of electrodes in a range from three to ten electrodes in the well structure (i.e. a base electrode and from two to nine stacked electrodes). Each stacked electrode layer is, in effect, a microlens array fabricated on a silicon substrate.

The particular implementation shown in FIG. 3A is further described as follows. Other specific dimensions and voltages may be utilized in other implementations, depending on the particular system being implemented. As shown in FIG. 3A, each well may be about 1.4 microns across.

In one example implementation, the voltages applied to the electrodes may be as follows.

The "top" conductive layer (Electrode 1) 311 may have an applied voltage of, for example, positive 3 volts. This relatively weak positive voltage applied to the uppermost conductive electrode to both screen the insulator from the incoming electron current and to deflect the incoming electrons with lower energy towards the inside of a nearest well.

The "upper" conductive stack layer (Electrode 2) 312 (about 1 micron below the "top" conductive stack layer) may have an applied voltage of, for example, positive 8.1 volts. This relatively strong positive voltage is applied to this electrode (which is just beneath the uppermost electrode) so as to both focus the incoming electrons by drawing them into the well and extracting the reflected electrons by drawing them out of the well.

The "middle" conductive stack layer (Electrode 3) 313 (about 1 micron below the "upper" conductive stack layer), and the "lower" conductive stack layer (Electrode 4) 314 (about 1 micron below the "middle" conductive stack layer) and may have applied voltages of +6.9 volts and +2.2 volts, respectively. The voltages applied to these two electrodes in the stack may be used to focus the electrons.

Finally, the base electrode 320 may have an applied voltage that is switched between two voltage levels in order to achieve the two different reflective modes (Mode A and Mode B). For example, a voltage of negative 1.3 volts (−1.3 V) may be applied to the base electrode to achieve Mode A (the reflective mode for the ON state), while a voltage of positive 0.2 volts (+0.2 V) may be applied to the base electrode to achieve Mode B (the reflective mode for the OFF state).

In Mode A, the focal length of the reflecting electron-optics is at or near infinity. This results in a reflected beam which is focused so that a substantial portion of the beam passes through the pupil aperture of the projection electron-optics. In contrast, in Mode B, the focal length of the reflecting electron-optics is such that the focal point lies within the well structure. This creates a divergence or de-focusing of the reflected electron beam which allows only a very small portion of the beam through the pupil aperture of the projection electron-optics.

Note that the above example voltages applied to the electrodes are provided for illustrative purposes. The voltages applied in an actual system will vary depending on the implementation. For instance, while the voltage on the base electrode is increased by 1.5 volts to go from Mode A to Mode B in the above-described implementation, decreasing the voltage on the base electrode by 1.5 volts may also work to go from Mode A to Mode B in another implementation.

Figure 3B:
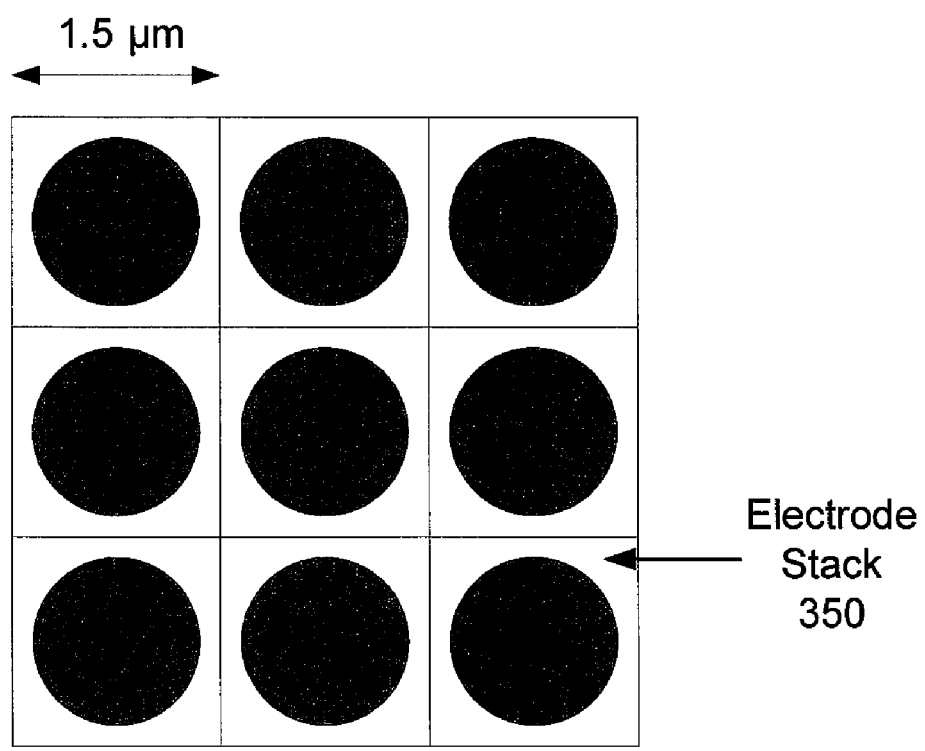
FIG. 3B is a diagram showing a top down view of a portion of a dynamic pattern generator in accordance with an embodiment of the invention.

FIG. 3B is a diagram showing a top down view of a portion of a dynamic pattern generator in accordance with an embodiment of the invention. As seen, this embodiment comprises well openings or cavities 302 that are round-shaped in a square grid. For example, the well openings may be 1.4 microns in diameter, and the pitch of the square grid may be 1.5 microns in diameter. As discussed above in relation to FIG. 3A, the interstitial regions 350 comprise the sidewalls of the wells and may be formed with a metal-insulator-metal-insulator-metal-insulator-metal-insulator stack (a tetrode or four electrode lens), and the bottom of each well 302 may comprise a base electrode. The voltage applied to each base electrode is individually controllable to achieve ON or OFF reflective states.

FIG. 4A is a schematic diagram showing incident and reflected electron rays in a first mode of operation of a switchable multiple-electrode electron reflector with a flat base electrode in accordance with an embodiment of the invention. This mode of operation is referred to above as reflective Mode A. The incident electron rays 402 within a multiple-electrode well are shown on the left side of the diagram, and the reflected electron rays 404 within the same multiple-electrode well are shown on the right side of the diagram. As seen, in this mode, for incident electron rays 402 which are parallel at the entrance of the well 403, the reflected electron rays 404 are also substantially parallel at the exit of the well 405.

FIG. 4B is a schematic diagram showing incident and reflected electron rays in a second mode of operation of a switchable multiple-electrode electron reflector with a flat base in accordance with an embodiment of the invention. This mode of operation is referred to above as reflective Mode B. The incident electron rays 402 within a multiple-electrode well are shown on the left side of the diagram, and the reflected electron rays 406 within the same multiple-electrode well are shown on the right side of the diagram. As seen, in this mode, for incident electron rays 402 which are parallel at the entrance of the well 403, the reflected electron rays 406 are also substantially divergent at the exit of the well 407.

In accordance with an embodiment of the present invention, a substantial portion of the reflected electron rays 404 in Mode A passes through the pupil aperture of the projection electron-optics and impinge upon a wafer being patterned. Meanwhile, only a very small portion of these reflected electron rays 406 in Mode B passes through the pupil aperture of the projection electron-optics and impinge upon a wafer being patterned. Note that, in FIGS. 4A and 4B, it is assumed that the incident electrons have a relatively small energy spread, for example, of less than one electron volt (<1.0 eV). In this case, a substantially larger energy spread in the incident electrons would result in the reflected electron rays having greater angular spread in their trajectories, and hence a substantially smaller portion of the reflected electron rays 404 in Mode A would pass through the pupil aperture of the projection electron-optics.

Figure 5:
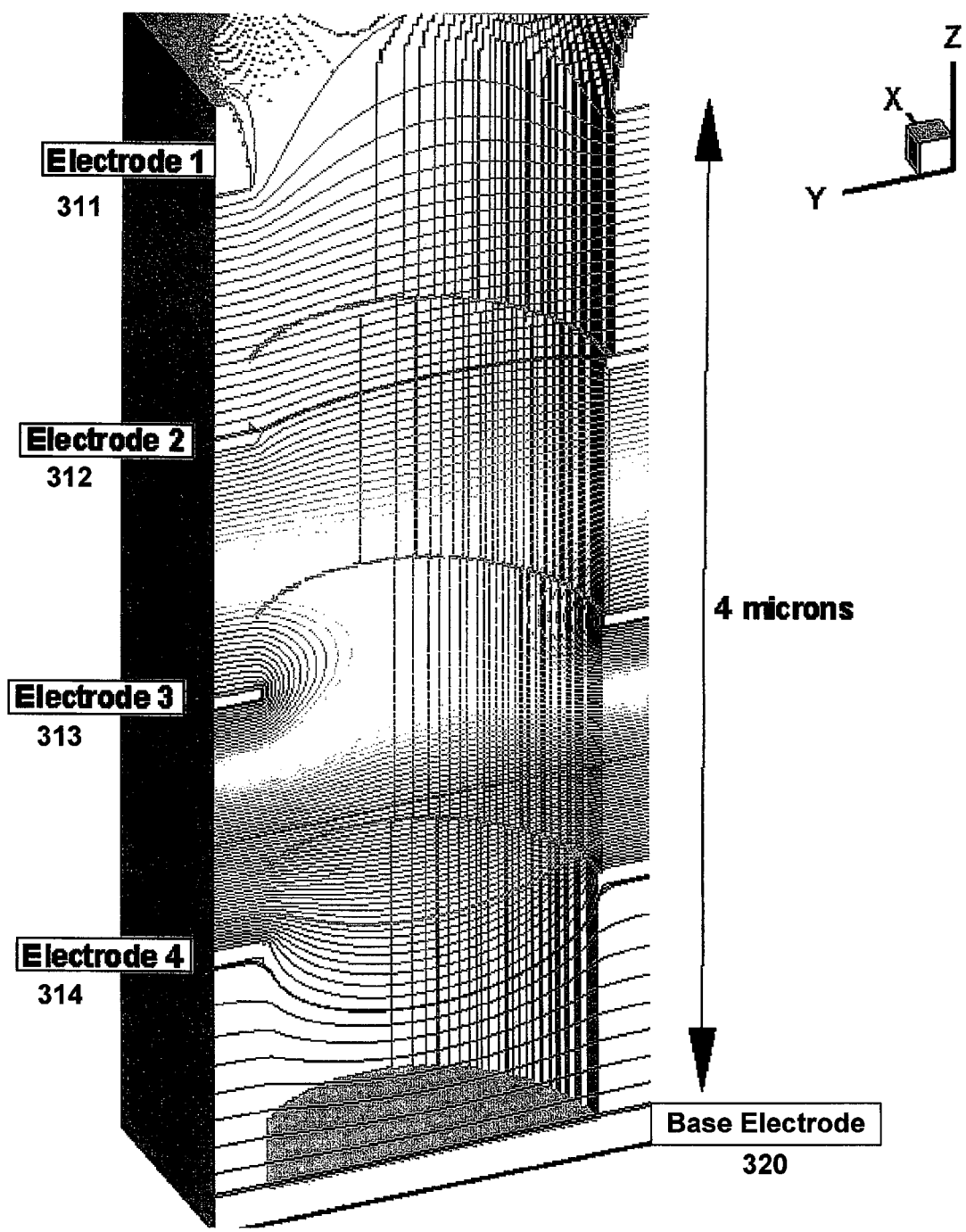
FIG. 5 is a three-dimensional design of a switchable multiple-electrode electron reflector with a flat base electrode in accordance with an embodiment of the invention.

FIG. 5 is a three-dimensional (3D) design of a switchable multiple-electrode electron reflector with a flat base electrode in accordance with an embodiment of the invention. The 3D design shows the flat base electrode 320 and four stacked electrodes (Electrode 1 311, Electrode 2 312, Electrode 3 313, Electrode 314).

Figure 6:
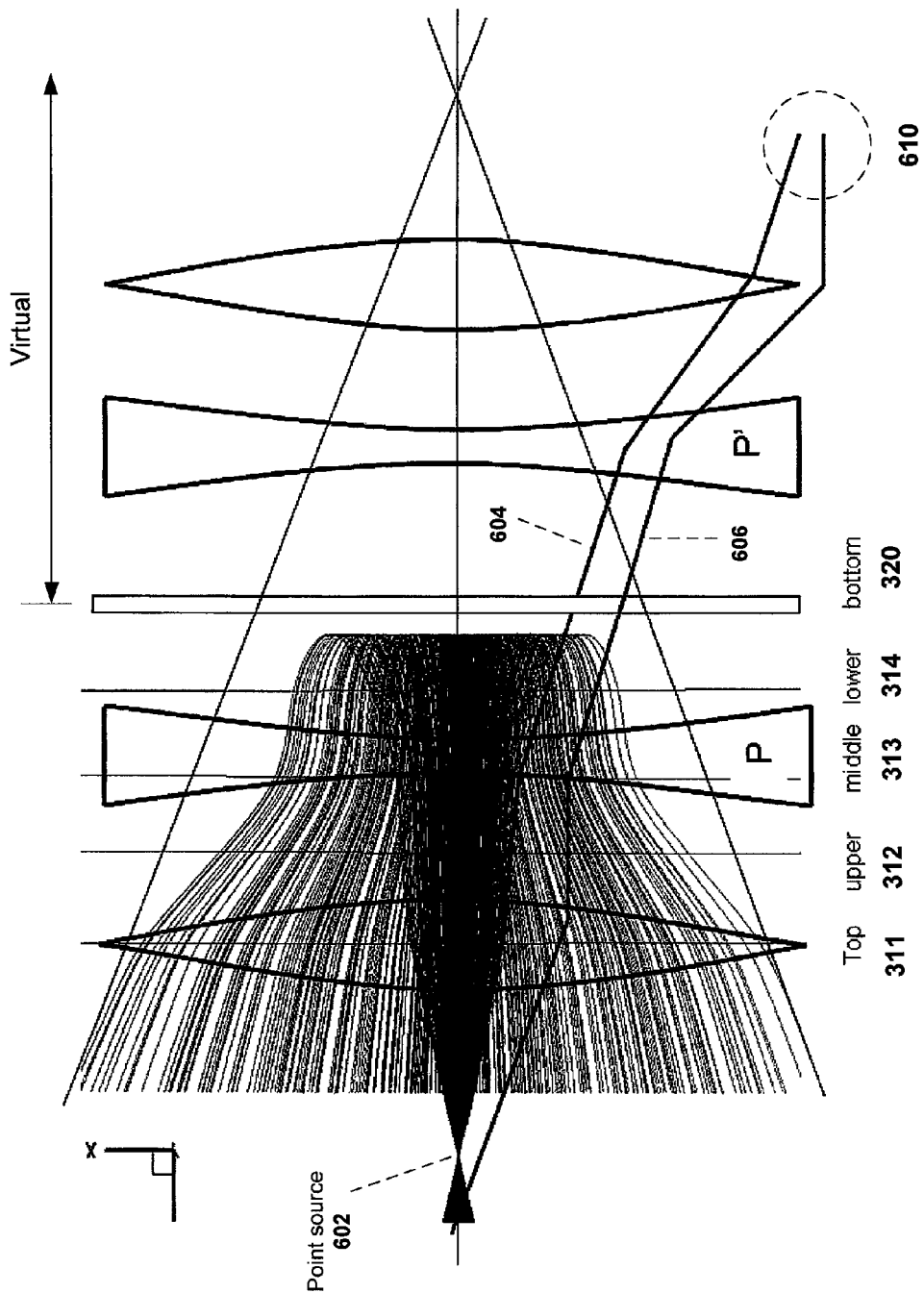
FIG. 6 is a ray tracing diagram depicting the trajectories of electrons from a point source as the electrons are reflected from a switchable multiple-electrode electron reflector with a flat base electrode in accordance with an embodiment of the invention.

FIG. 6 is a ray tracing diagram depicting the trajectories of electrons from a point source as the electrons are reflected from a switchable multiple-electrode electron reflector with a flat base electrode in accordance with an embodiment of the invention. Shown on the left side of the diagram are trajectories of electrons from a point source 602 as the electrons are reflected from the multiple-electrode electron reflector. The rays in the diagram show the electron trajectories as the electrons leave the point source 602, pass through the top 311, upper 312, middle 313, and lower 314 electrodes, and are reflected by the base (bottom) electrode 320.

Shown on the right side of the diagram is a virtual mirror image of the left side. The paraxial reflected paths of the first 604 and second 606 rays have been unfolded so that the left side represents the incoming rays and the right side represents the reflected rays. The region in between P and P' represents the region near the micro electrostatic mirror (base electrode 320). As seen, the first 604 and second 606 rays remain parallel in the region in between P and P', while they become skew outside of that region (see 610). That the two rays are not paraxial upon exit shows the occurrence of substantial chromatic aberration. Such aberration limits the use of the electron reflector with a flat base electrode to a beam of limited energy spread (in order to avoid severe aberration), and therefore limits beam current and reduces system throughput.

Figure 7:
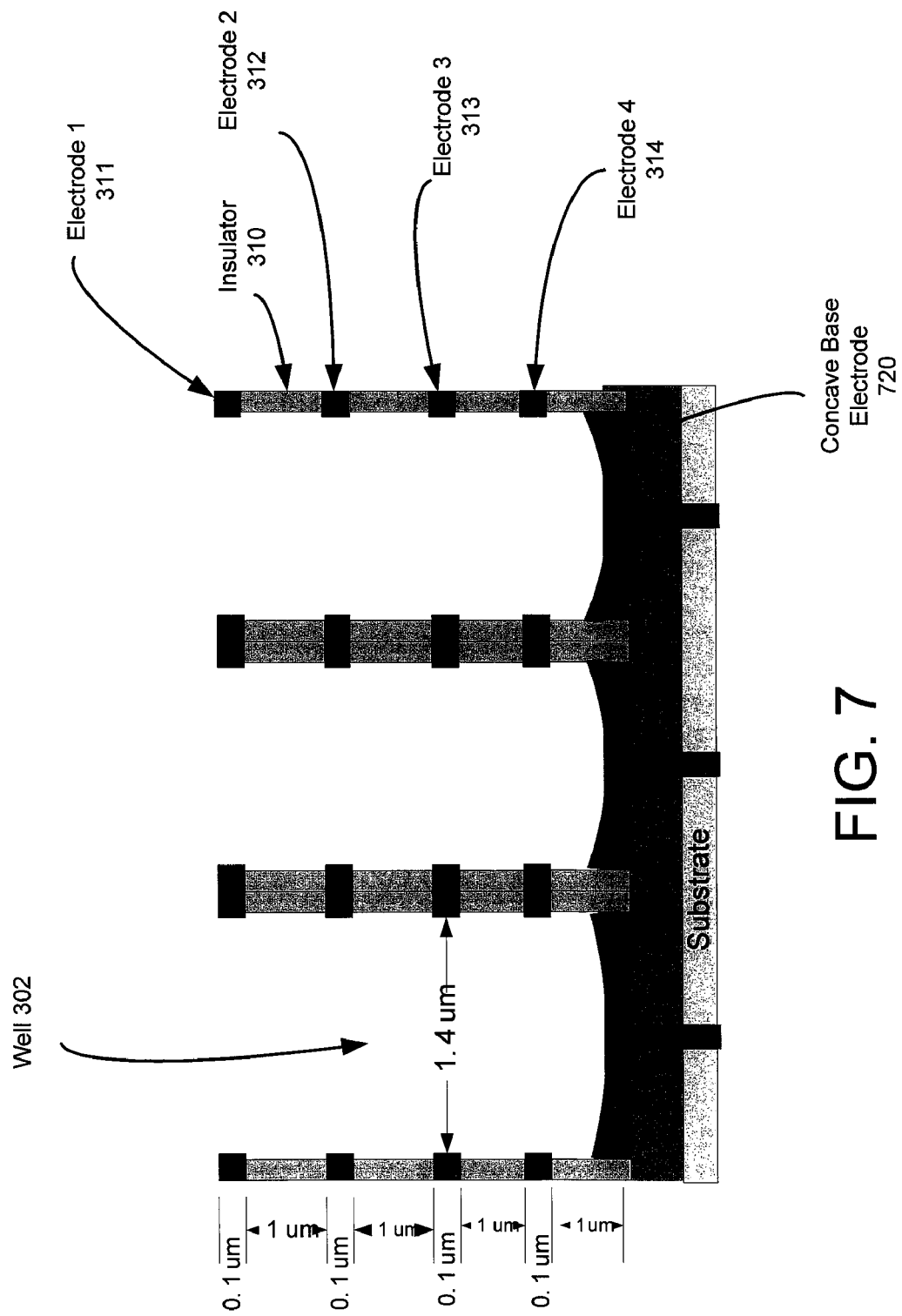
FIG. 7 is a cross-sectional diagram of a switchable multiple-electrode electron reflector for a pixel of a dynamic pattern generator in accordance with an alternate embodiment of the invention.

FIG. 7 is a cross-sectional diagram of a switchable multiple-electrode electron reflector for a pixel of a dynamic pattern generator in accordance with an alternate embodiment of the invention. The reflector shown in FIG. 7 is similar to the reflector shown in FIG. 3A. The difference between the two is that the base electrode 720 in the reflector of FIG. 7 is concave, while the base electrode 320 in the reflector of FIG. 3A is flat.

In one embodiment, voltages applied to the electrodes for a reflector with a concave base electrode may be as follows. Positive 5 volts for Electrode 1 311, positive 13.2 volts for Electrode 2 312, positive 18.2 volts for Electrode 3 313, and positive 0.4 volts for Electrode 4 314. For the concave base electrode 720, negative 5.2 volts (−5.2 V) may be applied for Mode A, and negative 3.7 volts (−3.7V) may be applied for Mode B.

Note that the above example voltages applied to the electrodes are provided for illustrative purposes. The voltages applied in an actual system will vary depending on the implementation. For instance, while the voltage on the base electrode is increased by 1.5 volts to go from Mode A to Mode B in the above-described implementation, decreasing the voltage on the base electrode by 1.5 volts may also work to go from Mode A to Mode B in another implementation.

Figure 8:
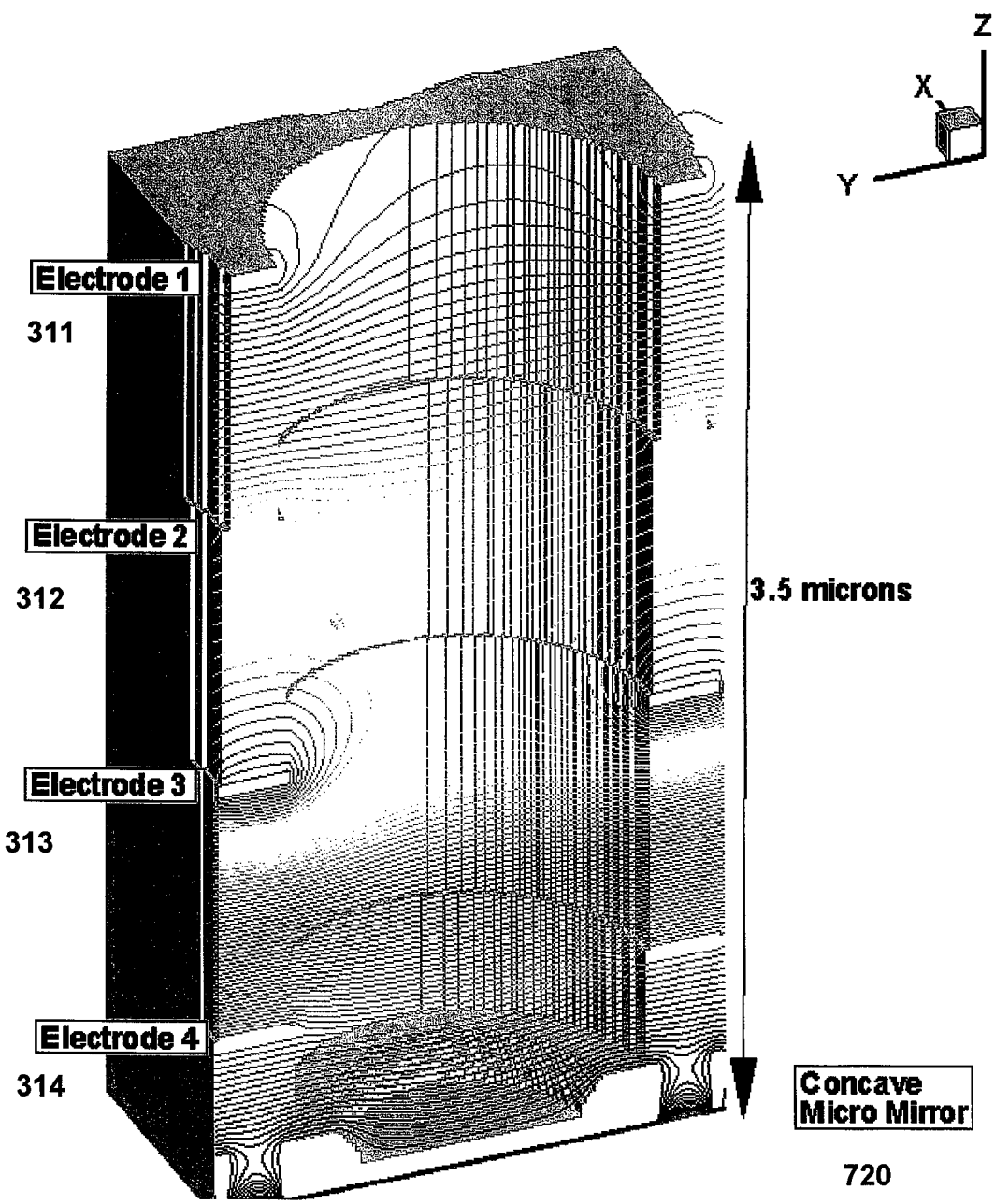
FIG. 8 depicts a three-dimensional design of a switchable multiple-electrode electron reflector with a concave base electrode in accordance with an alternate embodiment of the invention.

FIG. 8 depicts a three-dimensional (3D) design of a switchable multiple-electrode electron reflector with a concave base electrode in accordance with an alternate embodiment of the invention. The 3D design shows the concave base electrode 720 and four stacked electrodes (Electrode 1 311, Electrode 2 312, Electrode 3 313, Electrode 314).

Figure 9:
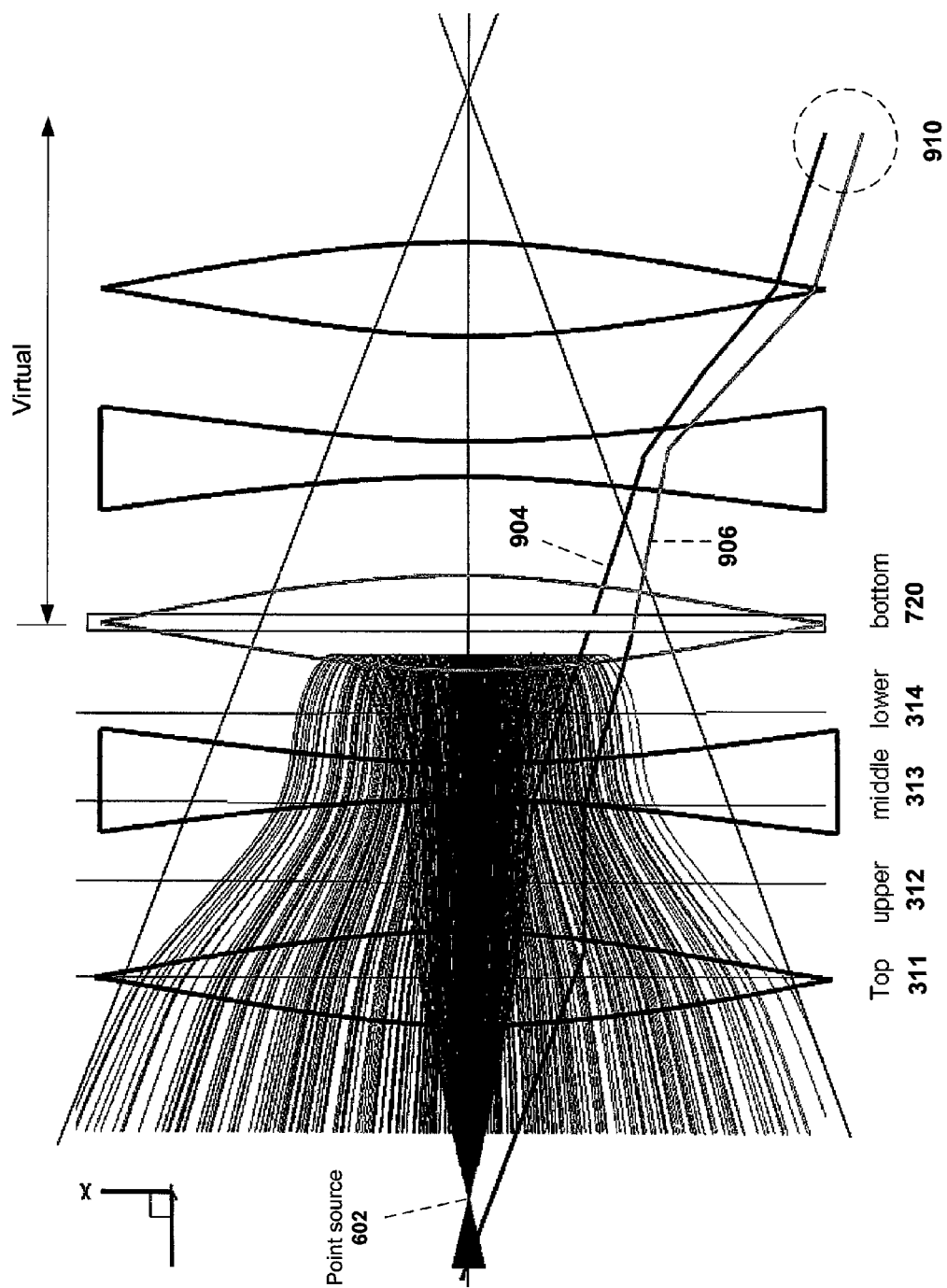
FIG. 9 is a ray tracing diagram depicting the trajectories of electrons from a point source as the electrons are reflected from a switchable multiple-electrode electron reflector with a concave base electrode in accordance with an embodiment of the invention.

FIG. 9 is a ray tracing diagram depicting the trajectories of electrons from a point source as the electrons are reflected from a switchable multiple-electrode electron reflector with a concave base electrode in accordance with an embodiment of the invention. Similar to FIG. 6, shown on the left side of the diagram are trajectories of electrons from a point source 602 as the electrons are reflected from the multiple-electrode electron reflector. The rays in the diagram show the electron trajectories as the electrons leave the point source 602, pass through the top 311, upper 312, middle 313, and lower 314 electrodes, and are reflected by the base (bottom) electrode 720. In this embodiment, the base electrode 720 is a concave electrode.

Shown on the right side of the diagram is a virtual mirror image of the left side. The paraxial reflected paths of the first 904 and second 906 rays have been unfolded so that the left side represents the incoming rays and the right side represents the reflected rays. The region in between P and P' represents the region near the micro electrostatic mirror (base electrode 720). In this case, the concave shape of the base electrode 720 effectively adds the illustrated converging lens (in comparison to the flat base electrode 320). The electron ray tracing shows that the first 904 and second 906 rays are parallel when they exit from the well (see 910). This is because the focusing action of the concave base electrode 720 and the top electrode 311 now compensate for the divergent effect therebetween (caused by the combined effect of the other electrodes). That the two rays are paraxial upon exit shows the absence of substantial chromatic aberration. This absence enables the use of a beam with wider energy spread and thereby enables increased beam current and higher system throughput.

Figure 10:
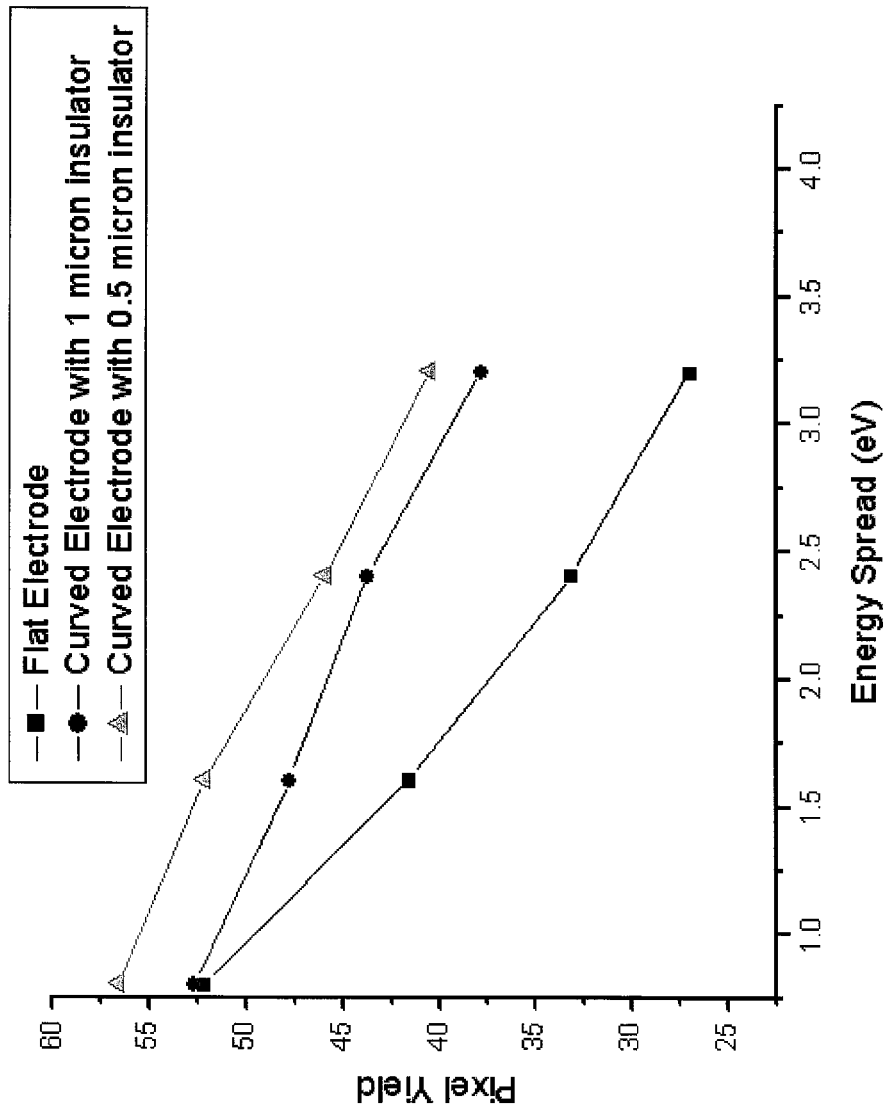
FIG. 10 is a graph of pixel yield versus energy spread for three multiple-electrode electron reflector designs.

FIG. 10 is a graph of pixel yield versus energy spread for three multiple-electrode electron reflector designs: a first design with a flat base electrode; a second design with a concave (curved) base electrode and 1 micron thick insulator (dielectric) layers between the stacked electrodes; and a third design with a concave (curved) base electrode and 0.5 micron thick insulator (dielectric) layers between the stacked electrodes. The pixel yields are obtained from simulations.

As shown, the pixel yield is between 50% to 60% for each design when the energy spread of the incident beam is less than 1.0 electron volt (eV). As the energy spread increases, the pixel yield remains substantially higher for the second and third designs with the concave base electrode than for the first design with the flat base electrode. Such that, when the energy spread is over 2.0 eV, the pixel yield is over 10% higher for the designs with the concave base electrode.

This advantageously higher pixel yield appears to be due to the afocal and achromatic relay micro lens formed by the multiple-electrode reflector with concave base electrode as disclosed herein. The afocal condition is advantageous in order not to exceed the numerical aperture of the system. The on/off switching of this micro device is obtained by forming the afocal condition to achieve the on state and breaking the afocal condition to achieve the off state.

FIG. 11A is a schematic diagram showing incident and reflected electron rays in a first mode of operation of a switchable multiple-electrode electron reflector with a concave base electrode in accordance with an embodiment of the invention. This mode of operation is referred to above as reflective Mode A. The incident electron rays 1102 within a multiple-electrode well are shown on the left side of the diagram, and the reflected electron rays 1104 within the same multiple-electrode well are shown on the right side of the diagram. As seen, in this mode, for incident electron rays 1102 which are parallel at the entrance of the well 1103, the reflected electron rays 1104 are also substantially parallel at the exit of the well 1105.

FIG. 11B is a schematic diagram showing incident and reflected electron rays in a second mode of operation of a switchable multiple-electrode electron reflector with a flat base in accordance with an embodiment of the invention. This mode of operation is referred to above as reflective Mode B. The incident electron rays 1102 within a multiple-electrode well are shown on the left side of the diagram, and the reflected electron rays 1106 within the same multiple-electrode well are shown on the right side of the diagram. As seen, in this mode, for incident electron rays 1102 which are parallel at the entrance of the well 1103, the reflected electron rays 1106 are also substantially divergent at the exit of the well 1107.

In FIGS. 11A and 11B, it is assumed that the incident electrons have a relatively large spread, for example, of greater than two electron volts (>2.0 eV). Advantageously, despite a substantially larger energy spread in the incident electrons, the reflector still operates effectively as an on/off switch using modes NB. This is due to the concave base electrode 720 reducing the chromatic aberration of the reflector. Hence, despite the larger energy spread, a substantial portion of the reflected electron rays 1104 in Mode A passes through the pupil aperture of the projection electron-optics and impinge upon a wafer being patterned. Meanwhile, only a very small portion of these reflected electron rays 1106 in Mode B passes through the pupil aperture of the projection electron-optics and impinge upon a wafer being patterned.

Figure 12:
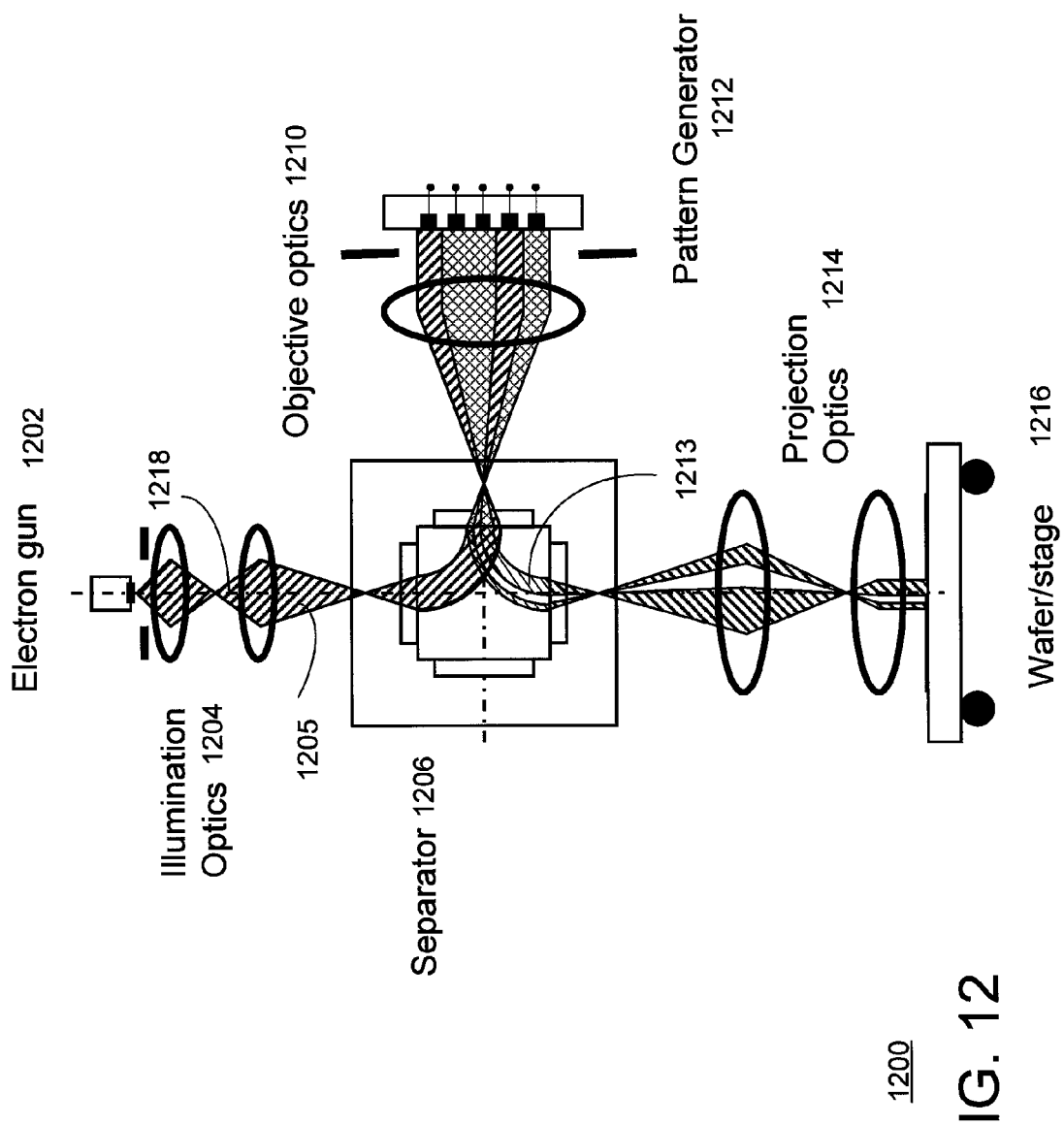
FIG. 12 is a schematic diagram of a maskless reflection electron beam projection lithography system in accordance with an embodiment of the invention.

FIG. 12 is a schematic diagram of a maskless reflection electron beam projection lithography system 1200 in accordance with an embodiment of the invention. The name may be abbreviated to a reflection electron beam lithography or REBL system. As depicted in FIG. 12, the system 1200 includes an electron source 1202, illumination electron-optics 1204, a separator 1206, an objective electron lens 1210, a dynamic pattern generator (DPG) 1212, projection electron-optics 1214, and a stage 1216 for holding a wafer or other target to be lithographically patterned. In accordance with an embodiment of the invention, the various components of the system 1200 may be implemented as follows.

The electron source 1202 may be implemented so as to supply a large current at low brightness (current per unit area per solid angle) over a large area. The large current is to achieve a high throughput rate. Preferably, the material of the source 1202 will be capable of providing a brightness of about $10^4$ or $10^5$ A/cm$^2$ sr (Amperes per cm$^2$ steradian). One implementation uses LaB$_6$, a conventional electron emitter, which typically have a brightness capability of about $10^6$ A/cm$^2$ sr, as the source material. Another implementation uses tungsten dispenser emitters, which typically have a brightness capability of about $10^5$ A/cm$^2$ sr when operating at 50 kilovolts, as the source material. Other possible emitter implementations include a tungsten Schottky cathode, or heated refractory metal disks (i.e. Ta).

The electron source 1202 may be further implemented so as to have a low energy spread. The REBL system 1200 should preferably control the energy of the electrons so that their turning points (the distance above the DPG 1212 at which they reflect) are relatively constant, for example, to within about 100 nanometers. To keep the turning points to within about 100 nanometers, the electron source 1202 would preferably have an energy spread no greater than 0.5 electron volts (eV). LaB$_6$ emitters have typical energy spreads of 1 to 2 eV, and tungsten dispenser emitters have typical energy spreads of 0.2-0.5 eV. In accordance with one embodiment of the invention, the source 1202 comprises a LaB$_6$ source or tungsten Schottky emitter that is operated a few hundred degrees C. below its normal operating temperature to reduce the energy spread of the emitted electrons. However, cooler operating temperatures can destabilize the source 1202, for example, due to impurities settling on the source surface and thereby diminishing its reliability and stability. Therefore, the source material may be preferably selected to be a material in which impurities are unlikely to migrate to the surface and choke off emission. Moreover, the vacuum on the system may be made stronger to overcome the impurity problem. Conventional lithography systems operate at a vacuum of $10^{-6}$ Torr. A scanning electron microscope (SEM) with a LaB$_6$ source typically operates at $10^{-7}$ Torr. A SEM with a Schottky emitter typically operates at $10^{-9}$ Torr or better in the gun region. In accordance with one implementation, the REBL operates with a gun region vacuum of $10^{-9}$ Torr or lower to protect the stability of the source 1202.

The illumination electron-optics 1204 is configured to receive and collimate the electron beam from the source 1202. The illumination optics 1204 allows the setting of the current illuminating the pattern generator structure 1212 and therefore determines the electron dose used to expose the substrate. The illumination optics 1204 may comprise an arrangement of magnetic and/or electrostatic lenses configured to focus the electrons from the source 1202. The specific details of the arrangement of lenses depend on specific parameters of the apparatus and may be determined by one of skill in the pertinent art.

A separator 1206 may be configured to receive the incident beam 1205 from the illumination optics 1204. In one implementation, the separator 1206 comprises a magnetic prism. When the incident beam traverses the magnetic fields of the prism, a force proportional to the magnetic field strengths acts on the electrons in a direction perpendicular to their trajectory (i.e. perpendicular to their velocity vectors). In particular, the trajectory of the incident beam 1205 is bent towards the objective lens 1210 and the dynamic pattern generator 1212. In one implementation, the magnetic prism may be configured with a non-uniform magnetic field so as to provide stigmatic focusing, for example, as disclosed in U.S. Pat. No. 6,878,937 to Marion Mankos, entitled "Prism Array for Electron Beam Inspection and Defect Review."

Below the separator 1206, the electron-optical components of the objective optics are common to the illumination and projection subsystems. The objective optics may be configured to include the objective lens 1210 and one or more transfer lenses (not shown). The objective optics receives the incident beam from the separator 1206 and decelerates and focuses the incident electrons as they approach the DPG 1212. The objective optics is preferably configured (in cooperation with the gun 1202, illumination optics 1204, and separator 1206) as an immersion cathode lens and is utilized to deliver an effectively uniform current density (i.e. a relatively homogeneous flood beam) over a large area in a plane above the surface of the DPG 1212. In one specific implementation, the objective lens 1210 may be implemented to operate with a system operating voltage of 50 kilovolts. Other operating voltages may be used in other implementations.

The dynamic pattern generator 1212 comprises an array of pixels. Each pixel may comprise a multiple-electrode electron reflector to which voltage levels are controllably applied.

The extraction part of the objective lens 1210 provides an extraction field in front of the DPG 1212. As the electrons reflected in the first reflective mode 1213 leave the DPG 1212, the objective optics is configured to accelerate the reflected electrons 1213 toward their second pass through the separator 1206. The separator 1206 is configured to receive the reflected electrons 1213 from the transfer lens 1208 and to bend the trajectories of the reflected electrons towards the projection optics 1214.

The projection electron-optics 1214 reside between the separator 1206 and the wafer stage 1216. The projection optics 1214 is configured to focus the electron beam and demagnify the beam onto photoresist on a wafer or onto another target. The demagnification may range, for example, from 1× to 20× demagnification (i.e. 1× to 0.05× magnification). The blur and distortion due to the projection optics 1214 is preferably a fraction of the pixel size. In one implementation, the pixel size may be, for example, 22.5 nanometers (nm). In such a case, the projection optics 1214 preferably has aberrations and distortions of less than 10-20 nm.

The wafer stage 1216 holds the target wafer. In one embodiment, the stage 1216 is stationary during the lithographic projection. In another embodiment, the stage 1216 is in linear motion during the lithographic projection. In the case where the stage 1216 is moving, the pattern on the DPG 1212 may be dynamically adjusted to compensate for the motion such that the projected pattern moves in correspondence with the wafer movement. In other embodiments, the REBL system 1200 may be applied to other targets besides semiconductor wafers. For example, the system 1200 may be applied to reticles. The reticle manufacturing process is similar to the process by which a single integrated circuit layer is manufactured.

Figure 13:
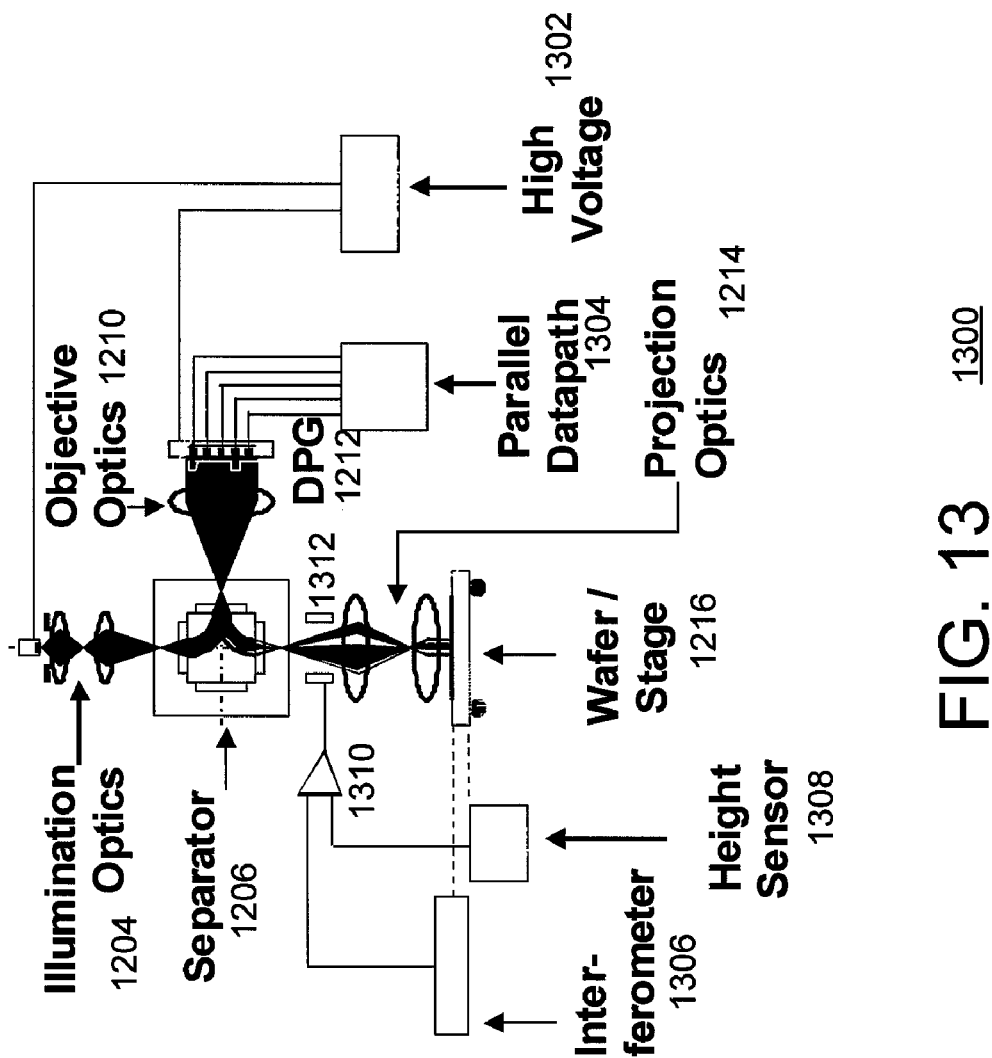
FIG. 13 is a schematic diagram of a maskless reflection electron beam projection lithography system showing further components in accordance with an embodiment of the invention.

FIG. 13 is a schematic diagram of a maskless reflection electron beam projection lithography system 1300 showing further components in accordance with an embodiment of the invention. The additional components illustrated include a high voltage source 1302, a parallel datapath 1304, an interferometer 1306, a height sensor 1308, feedback circuitry 1310, and beam deflectors 1312.

The high voltage source 1302 is shown as providing a high voltage to the source 1202 and to the DPG 1212. The voltage provided may be, for example, 50 kilovolts. The parallel data path 1304 is configured to carry control signals to the DPG 1212 for controlling the voltage on each pixel (so that it reflects electrons in a first reflective mode or a second reflective mode).

In one embodiment, the control signals are adjusted so that the pattern moves electronically across the DPG pixel array in a manner that is substantially the same as the way signals move through a shift register and at a rate so as to match the linear movement of the wafer. In this embodiment, each exposed point on the wafer may receive electrons reflected in the first reflective mode from an entire column (or row) of DPG pixels, integrated over time. In one implementation of this embodiment, the DPG 1212 is configured to resemble a static random access memory (SRAM) circuit.

In another embodiment, the control signals are such that the DPG 1212 exposes one complete frame at a time. In this embodiment, each pixel on the DPG 1212 exposes a corresponding pixel on the wafer. The pattern on the DPG 1212 remains constant during the exposure of each frame. In one implementation of this embodiment, the DPG 1212 is configured to resemble a dynamic random access memory (DRAM) circuit.

The interferometer 1306 may be included to provide tight coupling and positional feedback between the electron beam location and the target on the wafer. In one embodiment, the optical beams are reflected off mirrors on the stage. The resulting interference pattern depends on the difference of the individual beam paths and allows accurate measurement of the stage and wafer position. Vertical positional information may be provided by a height sensor 1308. The positional information may be fed back via feedback circuitry 1310 so as to control beam deflectors 1312. The deflectors 1312 are configured to deflect the projected beam so as to compensate for vibrations and positional drift of the wafer.

While FIGS. 12 and 13 depict an example system within which an embodiment of the invention may be implemented, embodiments of the invention may be implemented within other systems as well. For example, an embodiment of the invention may be implemented within a system which is configured with a Wien filter, rather than a magnetic prism separator. In such an embodiment, the incident electron beam would pass straight through the Wien filter to the DPG, and the portions of the beam that are reflected in a focused manner from the DPG would be deflected at an angle by the Wien filter to impinge upon the target substrate. In other embodiments, the multiple-electrode electron reflectors disclosed may be configured within an apparatus other than an electron beam lithography instrument.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method of controllably reflecting electrons from an array of electron reflectors, each electron reflector in the array comprising a base electrode and a well opening formed by sidewalls, the method comprising:
    forming an incident electron beam from an electron source;
    directing the incident electron beam to illuminate the array of electron reflectors such that electrons of the incident electron beam enter the well opening going towards the base electrode of each electron reflector in the array;
    configuring a first plurality of electron reflectors in the array to reflect electrons in a first reflective mode such that the reflected electrons exit the well opening going away from the base electrode of the reflector and form a focused beam; and
    configuring a second plurality of electron reflectors in the array to reflect electrons in a second reflective mode such that the reflected electrons exit the well opening going away from the base electrode of the reflector and are defocused.

2. The method of claim 1, wherein the electron reflectors each have multiple electrodes.

3. The method of claim 2, wherein a first voltage is applied to a base electrode to achieve the first reflective mode, and a second voltage is applied to the base electrode to achieve the second reflective mode.

4. The method of claim 3, wherein the base electrode comprises a concave electrode.

5. The method of claim 4, wherein the incident electron beam has an energy spread of greater than two electron volts.

6. The method of claim 1, wherein the sidewalls comprise a plurality of stacked electrodes separated by insulating layers surrounding the base electrode.

7. The method of claim 1, wherein the reflected electrons have substantially parallel trajectories when exiting an electron reflector configured in the first reflective mode, and wherein the reflected electrons have substantially divergent trajectories when exiting an electron reflector configured in the second reflective mode.

8. An apparatus of a dynamic pattern generator for reflection electron beam lithography, the apparatus comprising:
    a plurality of electron reflectors in an array, each electron reflector in the array comprising a base electrode and a well opening formed by sidewalls;
    control circuitry for configuring a first plurality of the reflectors to reflect electrons in a first reflective mode such that the reflected electrons exiting the well opening of each reflector of the first plurality travel away from the base electrode and form a focused beam; and
    control circuitry for configuring a second plurality of the reflectors to reflect electrons in a second reflective mode such that the reflected electrons exiting the well opening of each reflector of the second plurality travel away from the base electrode and are defocused.

9. The apparatus of claim 8, wherein the electron reflectors each have multiple electrodes.

10. The apparatus of claim 9, wherein a first voltage is applied to a base electrode to achieve the first reflective mode, and a second voltage is applied to the base electrode to achieve the second reflective mode.

11. The apparatus of claim 10, wherein the base electrode comprises a concave electrode.

12. The apparatus of claim 11, wherein the incident electron beam has an energy spread of greater than two electron volts.

13. The apparatus of claim 8, wherein the sidewalls comprise a plurality of stacked electrodes separated by insulating layers surrounding the base electrode.

14. The apparatus of claim 8, wherein the reflected electrons have substantially parallel trajectories when exiting an electron reflector configured in the first reflective mode, and wherein the reflected electrons have substantially divergent trajectories when exiting an electron reflector configured in the second reflective mode.

* * * * *